United States Patent [19]

Deutsch et al.

[11] 4,379,830

[45] Apr. 12, 1983

[54] DEVELOPER FOR POSITIVE PHOTOLITHOGRAPHIC ARTICLES

[75] Inventors: Albert S. Deutsch, Hartsdale; Christopher F. Lyons, Wappingers Falls; Robert Piller, White Plains, all of N.Y.

[73] Assignee: Polychrome Corporation, Yonkers, N.Y.

[21] Appl. No.: 308,960

[22] Filed: Oct. 6, 1981

[51] Int. Cl.³ .......................... G03C 5/30; C11D 3/04; C11D 7/06
[52] U.S. Cl. .................................... 430/309; 252/135; 252/156; 430/331
[58] Field of Search ....................... 252/547, 135, 156; 430/302, 309, 325, 326, 331

[56] References Cited

U.S. PATENT DOCUMENTS

| 1,990,925 | 2/1935 | Bennett | 430/309 |
| 2,062,273 | 11/1936 | Reed et al. | 252/156 |
| 2,407,290 | 9/1947 | Pursell | 430/309 |
| 2,466,423 | 8/1949 | Henn et al. | 430/486 |
| 3,394,005 | 7/1968 | Blake | 430/435 |
| 3,495,979 | 2/1970 | Laridon | 430/300 |
| 4,022,619 | 5/1977 | Pagliaro | 430/331 |
| 4,058,474 | 11/1977 | Keyes | 252/156 |
| 4,098,712 | 7/1978 | Ikeda et al. | 430/435 |
| 4,127,423 | 11/1978 | Rankin | 252/135 |
| 4,196,003 | 4/1980 | Watanabe | 430/310 |

Primary Examiner—M. F. Downey

[57] ABSTRACT

An improved aqueous alkaline developer for image-wise-exposed positive-acting photolithographic articles comprising a basic substance wherein the improvement comprises addition of a neutral salt of an alkali metal cation to the developer.

3 Claims, No Drawings

DEVELOPER FOR POSITIVE PHOTOLITHOGRAPHIC ARTICLES

This invention relates to aqueous alkaline developer compositions useful in the preparation of positive-acting photolithographic articles such as photoresists and lithographic printing plates. More particularly, it relates to an improved aqueous alkaline developer composition, of high development speed and capacity and decreased effect on the unexposed areas of the element, wherein the improvement comprises addition of a neutral salt to the developer composition.

It is well known in the art to prepare positive-acting photolithographic articles by imagewise exposing a positive-acting, radiation-sensitive element, comprising a suitable support on at least one surface of which there has been applied a positive-acting, radiation-sensitive composition, whereby the exposed non-image portions of said radiation-sensitive composition are rendered more soluble in, and are therefore removed from the support by treatment, with a developer while the unexposed, less soluble image portions are retained thereon.

Under the impact of environmental pressures photolithographic elements have been devised comprising coatings which may be developed by means of water, or at least, aqueous alkaline compositions. Among such coatings are the polymeric quinone azides as described in U.S. Pat. No. 3,647,443 or the monomeric quinone azides in combination with aqueous alkali-sensitive (defined as soluble or dispersible) additives such as, cresol-formaldehyde resins and resins containing carboxylate groups such as are described in U.S. Pat. No. 4,036,644.

Aqueous developers for such coatings include the aqueous solutions of bases such as the phosphates, hydroxides and silicates of alkali and alkaline earth metals and organic bases such as ethanolamine which may further comprise materials such as organic solvents and surface active agents.

It has, however, been found that the unexposed, image areas of such elements are not completely insensitive to attack by the developer and, dependent upon the duration of the development of the unexposed areas, are partially dissolved yielding final images of poorer resolution and quality.

In U.S. Pat. No. 3,495,979 (Feb. 17, 1970) there is claimed, and exemplified, an aqueous developer comprising sodium phosphate and sodium chloride. However, no reason is given, for the addition of the sodium chloride. Furthermore, the specification describes an alkaline developer as such as "an aqueous solution of a phosphate of an alkaline metal such as sodium phosphate". (Col. 3 lines 29-30). There is no indication within the specification of any advantage to be gained by addition of a neutral salt to the alkaline developer. In that respect, in a later U.S. Pat. No. 3,984,250 (Oct. 5,1976) the skilled workers were not led to add a salt to their sodium phosphate solution.

It has now unexpectedly been found, in accordance with this invention, that the above problem of dissolution of the image areas may be reduced, or minimized, while the speed of development and capacity of the developer are increased.

SUMMARY OF THE INVENTION

It is an object of this invention to provide an improved aqueous alkaline developer of high developing speed and capacity for positive-acting photolithographic articles, through the use of which dissolution of image areas is eliminated or minimized.

It is yet another object of the invention to provide a high-speed process for developing image-wise exposed photolithographic elements with minimal attack upon the image areas.

The above object and others which will be apparent are achieved by use of an aqueous alkaline composition to which at least one neutral salt is added.

DETAILED EMBODIMENT OF THE INVENTION

In accordance with this invention there is provided an improved aqueous alkaline developer of high speed and capacity and decreased effect on the unexposed areas of the articles, useful in the preparation of positive-acting photolithographic articles, wherein the improvement comprises addition of a neutral salt.

Thus, in accordance with this invention there is provided an aqueous alkaline developer comprising, I. at least one basic substance; and
II. at least one neutral salt with the proviso that the neutral salt is not sodium chloride when the basic substance is sodium phosphate.

If desired, the developer may further comprise at least one additive selected from the group consisting of organic solvents, surface active agents, and the like.

The basic substances useful in connection with the invention are known in the art and include phosphates, silicates, hydroxides, carbonates and borates of cations selected from the group consisting of alkali or alkaline earth metal ions, or quarternary ammonium ions; organic bases such as ethanolamines; and the like and mixtures thereof.

Preferred basic substances are the silicates, phosphates and hydroxides of the alkali and alkaline earth metal and quarternary ammonium ions, such as, phosphates and silicates of sodium, KOH, and $(CH_3)_4NOH$.

Most preferred basic substances are the silicates of sodium, KOH and $(CH_3)_4NOH$.

The neutral salts useful in accordance with the invention include inorganic salts of anions derived from strong mineral acids, such as HCl, $HNO_3$, $H_2SO_4$, and the like and alkali metal or quaternary ammonium cations.

The above salts may be illustrated by NaCl, KCl, KBr, and the like and mixtures thereof.

Preferred salts are NaCl and KCl, and mixtures thereof, with the proviso that when the basic substance is sodium phosphate, the salt is not NaCl.

Organic solvents useful in accordance with the invention are known in the art and include ethylene glycol monomethyl ether, benzyl alcohol, 2-butyoxyethanol, n-propanol, and the like and mixtures thereof.

Surface active agents for use in accordance with the invention are known in the art including, e.g., Triton X TM (Rohm and Haas), sodium isopropylnaphthalene sulfonate (e.g., Aerosol OS TM manufactured by American Cyanamid Co.), sulfuric acid or phosphoric acid ester salts of higher alcohols (of 6 to 22 carbon atoms), and the like and mixtures thereof.

The quantity of basic substance present in the developer will depend upon the particular radiation-sensitive coating used and a convenient development time. Generally, it will be within the range of 0.5 to 30% wt., preferably 1 to 20% wt., based on total weight of the developer.

The neutral salt will be used, according to the invention, in amounts ranging from 0.1 to 10% wt., and preferably from 2 to 5% wt., based on total weight of the developer.

According to this invention there is also provided a method for developing positive-acting photolithographic plates at high development speeds and low usage of the developer and minimal, if any, attack on the unexposed portions thereof which comprises treating imagewise exposed positive-acting, photolithographic elements with an aqueous alkaline developer comprising at least one basic substance and at least one neutral salt with the proviso that when said basic substance is sodium phosphate the neutral salt is not sodium chloride.

In a preferred embodiment of the invention the neutral salt will comprise KCl when the basic substance is KOH or said salt will comprise NaCl when the basic substance is a sodium silicate.

The developers according to this invention may be applied to the imagewise exposed photolithographic articles either manually or by machine by conventional methods as known in the art.

The following examples should be understood as illustrating the invention without departing from the scope thereof as described above and defined in the Claims.

EXAMPLE 1

For preparation of positive-acting photoresists.

I. Preparation of imagewise exposed elements

The radiation-sensitive composition (PC-129SF, Polychrome Corp.) was applied by spin-coating to oxidized Si wafers at 6000 RPM and the coated wafers heated at 90° C. for ½ hour.

The coated wafers were then exposed for about 5½ seconds, through a transparency, to a mercury vapor lamp in a Kasper aligner.

II. Development of exposed element
Two solutions were prepared as follows:

|  | Solution 1 | Solution 2 |
|---|---|---|
| Sodium metasilicate pentahydrate* | 30 g | 30 g |
| Aerosol OS TM | 2.16 g | 2.16 g |
| Water | 1 liter | 1 liter |
| Sodium Chloride | none | 30 g |

*(e.g., Metso TM Pentabead 20, manufactured by Philadelphia Quartz Co.)

Solution 2 developed the exposed element of Part I in 60 seconds to produce good quality images whereas Solution 1 was unable to effect development within that time.

EXAMPLE 2

Example 1 was repeated using Solution 1 except that the exposure time was 12 seconds and the development time 120 seconds. Development was again found to be incomplete. Even using longer exposure and development times, development was still incomplete. Results of Examples 1 and 2 clearly show addition of NaCl enhances performance of developer.

EXAMPLE 3

I. Exposed elements were prepared as indicated in Part I of Example 1.

II. The developer comprised aqueous solutions of KOH plus KCl. The quantities and results are given below.

| Experiment | KOH (g/l) | KCl (g/l) | Aerosol OS(g/l) | Exposure (sec.) | Dev. (sec.) |
|---|---|---|---|---|---|
| 1 | 17 | 23 | 2.16 | 5 | 30 |
| 2 | 17 | 23 | 2.16 | 3.5 | 60 |
| 3 | 17 | 37.8 | 2.16 | 4.5 | 30 |
| 4 | 15.3 | 23 | 2.16 | 6 | 30 |
| 5 | 15.2 | 37.8 | 2.16 | 5 | 30 |
| 6 | 13.7 | 37.8 | 2.16 | 6 | 40 |
| 7 | 12.0 | 37.8 | 2.16 | 6 | 60 |
| 8 | 17 | 0 | 2.16 | 5 | 150 |

It will be observed that addition of approximately 2.3% wt. KCl reduces the development time by 80% as shown in experiments 1 and 8. Furthermore, equivalent development times may be achieved at lower base concentrations upon addition of greater amounts of the neutral salt as may be seen in experiments 1 and 5.

EXAMPLE 4

Preparation of positive-acting lithographic printing plates.

I. Preparation of imagewise exposed elements

Samples (8 in. by 10 in.) of a presensitized plate (comprising a mechanically grained and anodized aluminum surface upon which had been applied a radiation-sensitive diazo-oxide) were exposed to 80 units of radiation, from a 5 KW metal halide lamp, in a Berkey-Ascor TM printing frame.

II. Development of exposed elements 50 ml. of either solution 1 or 'of part II of Example 1 were poured upon the exposed plates of part I of this example. It was found that the plates were completely developed within 10 to 30 seconds using solution 2 whereas use of solution 1 necessitated longer development times (on the order of minutes) and rubbing with a cotton swab.

EXAMPLE 5

Determination of development capacity of the developer. (Development capacity is defined as the amount of exposed material which may be removed from an exposed photolithographic element by a given amount of developer).

Two developer solutions were prepared as follows:

|  | Solution A | Solution B |
|---|---|---|
| Metso pentabead 20 | 6 gm. | 6 gm. |
| Aerosol OS | 0.21 gm. | 0.21 gm. |
| NaCl | none | 3 gm. |
| Water | 100 ml. | 100 ml. |

The above solutions were used in a PC-32 Automatic Plate Processor (Polychrome Corp.) to develop positive-acting lithographic elements which had been overall exposed to 80 units of radiation(as described in Example 4) whereby the amount of exposed radiation-sensitive coating is directly proportional to the total area of plates developed.

It was found that only 50 ft.$^2$ of plates could be developed with one gallon of solution 1 whereas solution 2 could develop at least 4 times as much (i.e., more than 200 ft.$^2$/gal.). Thus, it is seen that the presence of the salt enhances the developing power of the basic substance.

What is claimed is:

1. An improved alkaline developer for photolithographic articles comprising from 0.5 to 30% wt. sodium metasilicate, wherein the improvement comprises addition of from 2 to 5% wt. of sodium chloride, based on total weight of the developer.

2. The developer according to claim 1 further comprising at least one additive selected from the group comprising organic solvents and surface active agents.

3. An improved process for developing imagewise exposed positive-acting photolithographic articles by treating same with an aqueous alkaline developer comprising sodium metasilicate to remove the exposed, non-image area, the improvement comprising addition of sodium chloride to said developer.

* * * * *